US005607810A

United States Patent [19]

Verburgh et al.

[11] Patent Number: 5,607,810

[45] Date of Patent: Mar. 4, 1997

[54] METHOD FOR MAKING A LITHOGRAPHIC PRINTING PLATE REQUIRING NO WET PROCESSING

[75] Inventors: Yves Verburgh, Puurs; Joan Vermeersch, Deinze, both of Belgium

[73] Assignee: AGFA-Gevaert, N.V., Mortsel, Belgium

[21] Appl. No.: 570,958

[22] Filed: Dec. 12, 1995

[30] Foreign Application Priority Data

Jan. 30, 1995 [EP] European Pat. Off. .............. 95200221

[51] Int. Cl.$^6$ ................................ G03C 8/10; G03F 7/34

[52] U.S. Cl. ......................... 430/201; 430/200; 430/204; 430/964

[58] Field of Search .................................... 430/200, 201, 430/204, 964

[56] References Cited

U.S. PATENT DOCUMENTS

| | | | |
|---|---|---|---|
| 3,964,389 | 6/1976 | Peterson | 430/201 |
| 3,971,660 | 7/1976 | Staehle | 430/204 |
| 4,935,463 | 6/1990 | Stockel et al. | 524/423 |
| 5,256,506 | 10/1993 | Ellis et al. | 430/201 |
| 5,278,023 | 1/1994 | Bills et al. | 430/204 |
| 5,281,509 | 1/1994 | Murakata et al. | 430/204 |
| 5,402,725 | 4/1995 | Vermeersch et al. | 101/453 |
| 5,445,912 | 8/1995 | Hauquier et al. | 430/204 |
| 5,462,833 | 10/1995 | Hauquier et al. | 430/204 |
| 5,496,679 | 3/1996 | Hauquier et al. | 430/204 |
| 5,506,085 | 4/1996 | Van Damme et al. | 430/200 |
| 5,516,622 | 5/1996 | Savini et al. | 430/200 |
| 5,518,861 | 5/1996 | Coveleskie et al. | 430/200 |

FOREIGN PATENT DOCUMENTS

| | | |
|---|---|---|
| 0160395 | 11/1985 | European Pat. Off. . |
| 0450199 | 10/1991 | European Pat. Off. . |
| 0620502 | 10/1994 | European Pat. Off. . |
| 1315288 | 5/1973 | United Kingdom . |

OTHER PUBLICATIONS

Research Disclosure No. 33303, 1 Jan. 1992, Page 2, XP 000281114, J. Vermeersch, A Lithographic Printing Plate.

*Primary Examiner*—Richard L. Schilling
*Attorney, Agent, or Firm*—Breiner & Breiner

[57] ABSTRACT

There is provided a method for obtaining a lithographic printing plate requiring no wet processing comprising the steps of image-wise exposing using a laser beam a heat mode recording material comprising on a support a recording composition comprising a hydrophobic polymer and a substance capable of converting the laser beam radiation into heat while said heat mode recording composition is in contact with the acceptor layer of an acceptor element comprising a flexible support, said acceptor layer comprising a hardened non-proteinic hydrophilic polymer obtained by reacting a non-proteinic hydrophilic polymer containing a hydroxyl group or an amino or amido group having a free hydrogen with a hardener capable of reacting with said groups and separating said heat mode recording material from said acceptor material, characterized in that said recording composition comprises a thermal transferable dye which is transferred at the exposed areas from the recording material to the surface of the acceptor element.

10 Claims, No Drawings

METHOD FOR MAKING A LITHOGRAPHIC PRINTING PLATE REQUIRING NO WET PROCESSING

1. Field of the Invention

The present invention relates to a method for obtaining a lithographic printing plate requiring no wet processing by the use of a heat mode recording material and an acceptor material comprising a hydrophilic polymer.

2. Background of the Invention

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Two basic types of lithographic printing plates are known. According to a first type, so called wet printing plates, both water or an aqueous dampening liquid and ink are applied to the plate surface that contains hydrophilic and hydrophobic areas. The hydrophilic areas will be soaked with water or the dampening liquid and are thereby rendered oleophobic while the hydrophobic areas will accept the ink. A second type of lithographic printing plates operates without the use of a dampening liquid and are called driographic printing plates. This type of printing plates comprises highly ink repellant areas and oleophilic areas. Generally the highly ink repellant areas are formed by a silicon layer.

By far most printing plates belong to the class of the wet printing plates. However a drawback of most commercially available printing plate precursors that yield wet printing plates is the fact that they require a wet processing, frequently with possible harmful solutions so that the making of these wet printing plates is a cumbersome and time consuming operation. So, a method for obtaining wet printing plates requiring no wet processing is very much appreciated.

In EP-A 001,068 a lithographic printing plate requiring no wet processing is disclosed having an aluminum substrate with a hydrophilic, porous anodic oxide layer thereon and an oleophilic image deposited by sublimation from a carrier in and on the anodic oxide layer. A way of carrying out the sublimation is to place a carrier which is transparent to laser radiation having a laser responsive coating containing a sublimatable oleophilic material thereon face down on the lithographic substrate and depositing the oleophilic image by selected irradiation with a laser. However lithographic printing plates with an aluminum support are more expensive than lithographic plates with a flexible support and are therefore less favoured, surely for short-run jobs. Furthermore, when the lithographic printing plate precursor is also transparent, an exposure through the back of the lithographic printing plate precursor is also possible. Still further it is almost a prerequisite that the support of the acceptor element is a flexible support when said acceptor element will be applied to an external drum.

SUMMARY OF THE INVENTION

It is an object of the present invention to provide a method for obtaining a lithographic printing plate requiring no wet processing in an economical way.

Further objects of the present invention will become clear from the description hereinafter.

According to the present invention there is provided a method for obtaining a lithographic printing plate requiring no wet processing comprising the steps of image-wise exposing using a laser beam a heat mode recording material comprising on a support a recording composition comprising a hydrophobic polymer and a substance capable of converting the laser beam radiation into heat while said heat mode recording composition is in contact with the acceptor layer of an acceptor element comprising a flexible support, said acceptor layer comprising a hardened non-proteinic hydrophilic polymer obtained by reacting a non-proteinic hydrophilic polymer containing a hydroxyl group or an amino or amido group having a free hydrogen with a hardener capable of reacting with said groups and separating said heat mode recording material from said acceptor material, characterized in that said recording composition comprises a thermal transferable dye which is transferred at the exposed areas from the recording material to the surface of the acceptor element.

DETAILED DESCRIPTION OF THE INVENTION

According to the present invention it has been found that a lithographic printing plate obtained by image-wise exposing using a laser beam a heat mode recording material comprising on a support a recording composition comprising a hydrophobic polymer, a thermal transferable dye and a substance capable of converting the laser beam radiation into heat while said heat mode recording layer is in contact with the acceptor layer of an acceptor element comprising a flexible support, said acceptor layer comprising a hardened non-proteinic hydrophilic polymer obtained by reacting a non-proteinic hydrophilic polymer containing a hydroxyl group or an amino or amido group having a free hydrogen, With a hardener capable of reacting with said groups has good printing properties i.e. good ink acceptance in the printing areas, no ink acceptance in the non-printing areas and a good compatability with dampening solutions and printing inks commonly used in the art.

The recording composition of the heat mode recording material comprises a thermal transferable dye . Thermal transferable dyes in the context of the present invention are hydrophobic dyes capable of transferring from the recording composition to the acceptor layer when both layers are in contact which each other and are heated for 1 s at a temperature of 300° C., more preferably of 250° C., most preferable of 200° C. and are not capable of transferring from the recording composition to the acceptor layer when both layers are in contact which each other and are heated at a temperature of not more than 100° C. for not more than 1 s. Examples of such thermal transferable dyes suitable for use in the present invention are disclosed in numerous patents describing typical and specific examples of dyes for use in thermal dye sublimation transfer e.g., EP 209990, EP 209991, EP 216483, EP 218397, EP 227095, EP 227096, EP 229374, EP 235939, EP 247737, EP 257577, EP 257580, EP 258856, EP 279330, EP 279467, EP 285665, EP 400706, U.S. Pat. No. 4,743,582, U.S. Pat. No. 4,753,922, U.S. Pat. No. 4,753,923, U.S. Pat. No. 4,757,046, U.S. Pat. No. 4,769,360, U.S. Pat. No. 4,771,035, JP 84/78894, JP 84/78895, JP 84/78896, JP 84/227490, JP 84/227948, JP 85/27594, JP 85/30391, JP 85/229787, JP 85/229789, JP 85/229790, JP 85/229791, JP 85/229792, JP 85/229793, JP 85/229795, JP 86/41596, JP 86/268493, JP 86/268494, JP 86/268495 and JP 86/284489 and in Research Disclosure 353, no 35,341 of September 1993 which therefor are incorporated herein by reference.

The thermal transferable dyes is preferably used in an amount from 20% to 60%, more preferably from 30% to 50% by weight versus the dry weight of the heat mode recording composition.

Suitable supports for the heat mode recording material are transparent flexible organic resin supports e.g. cellulose nitrate film, cellulose acetate film, poly(vinyl acetal) film, polystyrene film, poly(ethylene terephthalate) film, polycarbonate film, polyvinylchloride film or poly-Alpha-olefin films such as polyethylene or polypropylene film.

Suitable polymers for the recording composition of the heat mode recording material are hydrophobic polymers which are capable of being ablated by heat. Appropriate hydrophobic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Polyacrylate and alpha-alkyl polyacrylate esters and copolymers, e.g. polymethyl methacrylate and polymethyl methacrylate/acrylic acid;

(K) Phenolformaldehyde resins;

(L) Polyvinyl chloride and copolymers, e.g. polyvinyl chloride/acetate, polyvinylchloride/acetate/alkohol;

(M) Polyvinyl acetal, e.g. polyvinyl butyral, polyvinyl formal;

(N) Polyformaldehydes;

(O) Polyurethanes and copolymers;

(P) Polycarbonate and copolymers;

(Q) Polystyrenes and copolymers e.g. polystyrene/acrylonitrile, polystyrene/acrylonitrile/butadiene.

Said hydrophobic polymers can be used in admixture. Preferably they are present in the recording composition in an amount from 20% to 75% by weight. Preferred hydrophobic polymers are e.g. polyesters, polyacrylate and alpha-alkyl polyacrylate esters and copolymers, phenolformaldehyde resins of the novolac type.

Examples of substances capable of converting the laser beam radiation into heat are e.g. carbon black, infrared or near infrared absorbing dyes or pigments, metals such as Bi, Sn, Te etc. or a combination thereof. Suitable infrared dyes are disclosed in e.g. U.S. Pat. No. 4,833,124, EP-321923, U.S. Pat. No. 4,772,583, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,950,640, U.S. Pat. No. 4,912,083, U.S. Pat. No. 4,952,552, U.S. Pat. No. 5,024,990, U.S. Pat. No. 5,023,229 etc. Suitable infrared pigments are e.g. HEUCODOR metal oxide pigments available from Heubach Langelsheim. When a metal such as e.g. bismuth is used as a heat converting substance the recording layer is preferably a vacuum deposited metal layer.

Preferably the recording composition of the heat mode recording material comprises oxidizable or explosive substances to increase the sensitivity. Nitrocellulose, peroxides, azides and nitrates are examples of these substances. Preferably nitrocellulose is used in an amount from 5% to 50% by weight versus the dry weight of the heat mode recording composition.

According to the present invention the thickness of the recording composition is preferably not more than 3 μm in order to obtain a printing plate of acceptable quality, more preferably the thickness will be less than 2.5 μm, more preferably the thickness will be between 150 Å and 1.5 μm.

In a preferred embodiment the recording composition will consist of one layer. It is clear that in this embodiment the recording composition constitutes the top layer of the heat mode recording material. However, the recording composition can consist of two layers contiguous to each other. The top layer then comprises the hydrophobic polymer and the optional thermal transferable dye while the underlying layer comprises the substance capable of converting the laser beam radiation into heat. The optional oxidizable or explosive substance can be contained in either of the two layers but is preferably at least partially contained in the top layer. As binder for the underlying layer may be used any of the hydrophobic polymers mentioned above as suitable polymer for use in the recording composition.

An acceptor element according to the present invention comprises a flexible support and an acceptor layer comprising a hardened non-proteinic hydrophilic polymer obtained by reacting a non-proteinic hydrophilic polymer containing a hydroxyl group or an amino or amido group having a free hydrogen with a hardener capable of reacting with said groups.

Non-proteinic hydrophilic polymers containing an hydroxy group can be natural polymers e.g. cellulose, hydroxymethyl cellulose, saccharides, starch, alginates or preferably synthetic polymers e.g. homopolymers and copolymers of vinyl alcohol, methylol acrylamide, methylol methacrylamide, hydroxyethyl acrylate, hydroxyethyl methacrylate. More preferably polyvinyl alcohol hydrolyzed to at least an extent of 60 percent by weight, more preferably at least 80 percent by weight is used.

Non-proteinic hydrophilic polymers containing an amino or amido group having a free hydrogen can be synthetic polymers e.g. homopolymers and copolymers of acrylamide, methacrylamide or preferably dextrans or pullulan wherein at least some of the hydroxy groups have been modified into one or more of the following groups:

$$—O—R^1$$

$$—O—CO—R^2$$

wherein $R^1$ represents an organic residue containing an amine or amide function having a free hydrogen atom, e.g.

an amine substituted alkyl, an amine substituted alkylaryl etc. $R^2$ has one of the significances given for $R^1$ or stands for $—OR^3$ or $—N(R^4)R^5$, wherein $R^3$ has one of the significances given for $R^1$ and each of $R^4$ and $R^5$ which may be the same or different represents—provided that the group $—O—CO—R^2$ contains at least one amine or amide function having a free hydrogen—hydrogen or an organic group e.g. an alkyl group, a substituted alkyl group, an aryl group, a substituted aryl group, an alkylaryl group, an organic residue containing an amine or amide function having a free hydrogen atom.

Pullulan is a polysacharide that is produced by microorganisms of the Aureobasidium pullulans type (Pullularia pullulans) and that contains maltotriose repeating units connected by a α-1,6 glycosidic bond. Pullulan is generally produced on industrial scale by fermentation of partially hydrolysed starch or by bacterial fermentation of sucrose. Pullulan is commmercially available from e.g. Shodex, Pharmacosmos.

Examples of dextrans or pullulan suitable for use in accordance with the present invention are dextrans or pullulan wherein some of the hydroxyl groups have been modified in one of the groups shown in table 1.

TABLE 1

| no. | modified group |
|---|---|
| 1 | $—O—CH_2—CH_2—NH_2$ |
| 2 | $—O—CO—NH—CH_2—CH_2—NH_2$ |
| 3 | $—O—CO—NH—CH_2—CH_2—N(CH_2—CH_2—NH_2)_2$ |
| 4 | $—O—CO—NH—(CH_2—CH_2—O)_n—CH_2—CH_2—NH_2$ wherein n represents an integer from 1 to 50 |
| 5 | $—O—CH_2—CH_2—NH—CH_2—CH_2—NH_2$ |

The modified dextrans or pullulan can be prepared by a reaction of a dextran or pullulan with e.g. alkylating agents, chloroformates, acid halides, carboxylic acids etc.

Although the non-proteinic hydrophilic polymers containing a hydroxyl group or an amino or amido group having a free hydrogen can be used in admixture, it is preferred to use either non-proteinic hydrophilic polymers containing a hydroxyl group or non-proteinic hydrophilic polymers containing an amino or amido group having a free hydrogen. It is even more preferred to use in the acceptor layer as non-proteinic hydrophilic polymers only polymers with the same or very similar structure (e.g. polyvinyl alcohol of different saponification degrees) which however may vary in molecular weight.

The acceptor layer preferably contains non-proteinic hydrophilic polymers containing a hydroxyl group or an amino or amido group having a free hydrogen in an amount from 0.1 $g/m^2$ to 7 $g/m^2$, more preferably in an amount from 0.3 $g/m^2$ to 4 $g/m^2$, According to the present invention a non-proteinic hydrophilic polymer containing a hydroxyl group or an amino or amido group having a free hydrogen is reacted with a hardener capable of reacting with said groups.

Appropriate hardening agents for non-proteinic hydrophilic polymers containing a hydroxyl group or an amino or amido group having a free hydrogen are those of the epoxide type, those of the ethylenimine type, aldehydes e.g. formaldehyde, glyoxal, and glutaraldehyde, N-methylol compounds e.g. dimethylolurea and methyloldimethylhydantoin. The binders can also be hardened with fast-reacting hardeners such as carbamoylpyridinium salts.

Appropriate hardening agents for non-proteinic hydrophilic polymers containing an amino group are further those of the vinylsulfone type e.g. 1,3-vinylsulphonyl-2-propanol, chromium salts e.g. chromium acetate and chromium alum, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid.

The appropriate hardeners can be used alone or in combination. The degree of hardening may be adjusted at wish.

Preferred hardeners for non-proteinic hydrophilic polymer containing a hydroxyl group, especially for polyvinyl alcohols are hydrolyzed tetraalkyl orthosilicates.

Examples of hydrolyzed tetraalkyl orthosilicate crosslinking agents are hydrolyzed tetraethyl orthosilicate and hydrolyzed tetramethyl orthosilicate. The amount of tetraalkyl orthosilicate crosslinking agent is preferably at least 0.2 parts by weight per part by weight of non-proteinic hydrophilic polymer, more preferably between 0.5 and 5 parts by weight, most preferably between 1 and 3 parts by weight.

Preferably non-proteinic hydrophilic polymers containing an amino or amido group having a free hydrogen are hardened with an aldehyde e.g. formaldehyde, glutaraldehyde, glyoxal or a mixture thereof. Alternatively the oxidation product of e.g. a periodate oxidation of dextran may be used for hardening.

The hardened acceptor layer preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides, preferably of titanium dioxide having an average size from 0.3 μm to 0.5 μm. By incorporating these particles the surface of the layer is given a uniform rough texture consisting of microscopic hills and valleys, which serve as storage places for water in background areas.

According to a preferred embodiment in connection with the present invention the roughness of the acceptor layer is adjusted such that an arithmetical mean deviation of profile $R_a$ of at least 0.3 μm, more preferably of at least 0.5 μm, most preferably of at least 0.7 μm is obtained. $R_a$ is obtained in accordance with the following formula:

$$R_a = (1/m) \cdot \int_0^m |f(x)| dx \; (\mu m)$$

with $m$ being 0.8

The profile of said acceptor layer is measured with a perthometer Mahr Perthen S6P containing as measuring head RTK 50 (tradenames of Feinpruef Perthen GmbH, Goettingen, Germany) equipped with a diamond stylus with a diameter of 5 μm under a pressure of 1.0 mN.

Supports suitable for use in the acceptor element may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly(ethylene terephthalate) film, polycarbonate film, polyvinylchloride film or poly-Alpha-olefin films such as polyethylene or polypropylene film.

One or more subbing layers may be coated between the flexible hydrophobic support and the nearest hydrophilic layer and contiguous to said nearest hydrophilic layer, being the acceptor layer or an optional intermediate hydrophilic layer as described below in order to get an improved adhesion between the hydrophobic support and the nearest hydrophilic layer.

A preferred subbing layer for use in connection with the present invention, is a subbing layer comprising a hydrophilic binder and silica.

As hydrophilic binder in said subbing layer usually a protein, preferably gelatin may be used. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

A preferred silica in said subbing layer is a siliciumdioxide of the anionic type. The colloidal silica preferably has a surface area of at least 300 $m^2$ per gram, more preferably a surface area of 500 $m^2$ per gram.

The surface area of the colloidal silica is determined according to the BET-value method described by S. Brunauer, P. H. Emmett and E. Teller, J. Amer. Chem. Soc. 60, 309–312 (1938).

The silica dispersion may also contains other substances, e.g. aluminium salts, stabilising agents, biocides etc.

Such types of silica are sold under the name KIESELSOL 300 and KIESELSOL 500 (KIESELSOL is a registered trade name of Farbenfabriken Bayer AG, Leverkusen, West-Germany whereby the number indicates the surface area in $m^2$ per gram).

The weight ratio of the hydrophilic binder to silica in the subbing layer is preferably less than 1. The lower limit is not very important but is preferably at least 0.2. The weight ratio of the hydrophilic binder to silica is more preferably between 0.25 and 0.5.

The coverage of said subbing layer is preferably more than 200 mg per $m^2$ but less than 750 mg per $m^2$, more preferably between 250 mg per $m^2$ and 500 mg per $m^2$.

The coating of the above defined subbing layer composition preferably proceeds from an aqueous colloidal dispersion optionally in the presence of a surface-active agent.

Optionally, an intermediate hydrophilic layer is coated between the support, optionally provided with a subbing layer and the acceptor layer. As hydrophilic binder in said intermediate hydrophilic layer usually a protein, preferably gelatin may be used. Gelatin can, however, be replaced in part or integrally by synthetic, semi-synthetic, or natural polymers as mentioned above.

Said intermediate hydrophilic layer is preferably hardened. Appropriate hardening agents especially when the hydrophilic binder is gelatin are e.g. those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Said intermediate hydrophilic layer comprises hydrophilic binder preferably in the range from 0.5 $g/m^2$ to 10 $g/m^2$, more preferably in the range from 0.8 $g/m^2$ to 6 $g/m^2$, most preferably in the range from 1.1 $g/m^2$ to 4 $g/m^2$.

Prefarably said intermediate hydrophilic layer comprises matting agents. More preferably the number average diameter of the matting agent should be greater than the thickness of the intermediate hydrophilic layer so as to be protruding into the acceptor layer and so increasing the Ra value of the acceptor layer.

Although the term "diameter" is used to characterise the size of the matting agent, this does not imply that the matting agent has to be spherical in shape. When the matting agent is not spherical in shape, a hypothetical diameter can be used corresponding to a sphere having an equivalent volume. The average diameter of a matting agent in connection with the present invention can be measured by means of a Coulter Counter. The total coverage of matting agent in the intermediate hydrophilic layer is preferably between 0.1 $g/m^2$ and 10 $g/m^2$ more preferably between 1 $g/m^2$ and 5 $g/m^2$.

Suitable matting agents for use in connection with the present invention are organic and inorganic matting agents e.g. silica, alumina, calcium carbonate, starch, polymethylmethacrylates, polyethylacrylates or mixtures thereof.

Before exposure the recording composition of the heat mode recording material and the acceptor layer of the acceptor material are brought in intimate contact with each other e.g. by taping the two materials to each other.

According to the method of the present invention the heat mode recording material is image-wise exposed using a laser. Preferably used lasers are e.g. semiconductor lasers, YAG lasers e.g. Nd-YAG lasers, Argon lasers etc. The laser may have a power output between 40 and 7500 mW and preferably operates in the infrared part of the spectrum. Preferably the image-wise exposure proceeds through the support of the heat mode recording material. When the acceptor material is transparent, the image-wise exposure may also proceed through the support of the acceptor material.

Subsequent to the image-wise exposure the acceptor material is separated from the heat mode recording material and can then be used as a lithographic printing plate. It is however advantageous to overall expose said lithographic printing plate to heat to improve its printing properties e.g. ink acceptance and printing endurance. A preferred way of overall exposing said lithographic printing plate to heat is by conveying said lithographic printing plate through a heated roll laminator device.

The following examples illustrate the present invention without limiting it thereto. All percentages are by weight unless stated otherwise.

EXAMPLE 1

Preparation of the Heat Mode Recording Materials A-1 till C-3.

These heat mode recording materials are prepared by coating on a polyethylene therephthalate film support having a thickness of 175 μm by means of a knife coater recording layers at a dry weight of 1 $g/m^2$. The composition of the recording layers is given in table 2.

Preparation of the Acceptor Material M.

Preparation of Dextran 1 (Modified Group 2 of Table 1)

43 g of a dextran having a weight average molecular weight of 70000 g/mol was dissolved in 2 l of a dry mixture of equal volumes of dimethylsulfoxide and pyridine. This solution was cooled to 0° C. and 43 g of p-nitrophenylchloroformate and 1.5 g of dimethylaminopyridine were added. This mixture was kept four hours at 0° C. and was then dropwise added to 1 l of 1,2-diaminoethane. The resulting reaction mixture was then stirred for 48 hours at room temperature. The obtained modified dextran was isolated from the reaction mixture by precipitation in a 3 to 1 by volume mixture of methanol and diethylether and subsequent filtrated. The amine content of the modified dextran was about 1.39 mmol/g.

Preparation of the Coating Solution for the Acceptor Layer.

To 440 g of a dispersion containing 21.5% TiO2 (average particle size 0.3 to 0.5 um) was subsequently added, while stirring, 250 g of a 5% solution of DEXTRAN 1 in water, 38 g of a 3.5% solution of glyoxal in water, 22 g of a 10% solution of a wetting agent and 250 ml water. The pH was adjusted to 4 with a 12% hydrogen chloride solution.

Preparation of the Acceptor Material.

The coating solution for the acceptor layer was coated on a polyester support containing a subbing layer at a wet coating thickness of 50 g/$m^2$ and dried at 35° C.

Preparation of the Lithographic Printing Plates AA-1 till CC-3.

The recording layer of the appropriate heat mode recording material (A-1 till C-3) is brought in intimate contact with the acceptor layer of a sample of the acceptor material M by means of an adhesive tape. The package of the heat mode recording material and the acceptor material are applied on the cylinder of an external drum laser equipment by means of an adhesive tape and/or vacuum suction. At a frequency of rotation of 800 r.p.m. the package is information-wise exposed through the support of the heat mode recording material, whereby the laser beam (ND-YLF 1053 nm, diameter of the spot 14,9 μm, output 0.4 W) is focused in the recording layer.

Subsequently, the acceptor material is separated from the respective heat mode recording materials yielding the respective printing plates. The printing plates are used to print on a conventional offset press (GTO-46) using a commonly employed ink (K+E 123W) and fountain (Combifix 3% in water-isopropanol 90:10 by volume). There were printed 1000 copies of each printing plate. The quality of the obtained copies, as judged on the $10^{th}$ copy is given in table 2.

TABLE 2

| | Composition of recording layer | | | | |
|---|---|---|---|---|---|
| Pr. Pl.[a] | Nr. | IR-1[b] | TTD-1[c] | Pol.[d] | Q. copy[e] |
| AA-1 | A-1 | 20% | 40% | Pol. 1 - 40% | 3–4 |
| AA-2 | A-2 | 20% | 0% | Pol. 1 - 80% | 3 |
| AA-3 | A-3 | 0% | 40% | Pol. 1 - 60% | 0 |
| BB-1 | B-1 | 20% | 40% | Pol. 2 - 40% | 3–4 |
| BB-2 | B-2 | 20% | 0% | Pol. 2 - 80% | 3 |
| BB-3 | B-3 | 0% | 40% | Pol. 2 - 60% | 0 |
| CC-1 | C-1 | 20% | 40% | Pol. 3 - 40% | 3–4 |
| CC-2 | C-2 | 20% | 0% | Pol. 3 - 80% | 3 |
| CC-3 | C-3 | 0% | 40% | Pol. 3 - 60% | 0 |

[a]Pr. Pl.: Printing plate number

[b]IR-1: two component Ir-absorber in the region of 1000 to 1100 nm: KU3 - 2052 from Bayer

[c]TTD-1: thermal transferable dye with the following formula

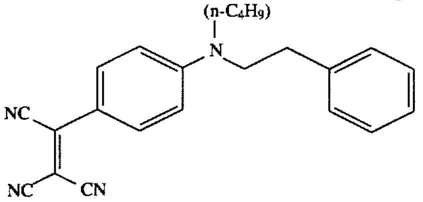

(TTD-1)

[d]Pol. 1: polyester KCT 33 of BASF

Pol. 2: copolymer of methylmethacrylate-acrylic acid (80:20)

Pol. 3: fenolformaldehyde resin of the novolac type Milex XL 225 of Mitsui

[e]Q copy: this is a visual relative evaluation of the 10th copy obtained from said printing plate 5: excellent; 4: good; 3: acceptable; 2: not acceptable; 1:barely ink accepting; 0: no ink acceptance Evaluation:

It is clear from the results in table 2 that a lithographic printing plate requiring no wet processing can be obtained by a process comprising the steps of image-wise exposing using a laser beam a heat mode recording material comprising on a support a recording composition comprising a hydrophobic polymer and an IR-dye while said heat mode recording composition is in contact with the acceptor layer of an acceptor element comprising a flexible support and separating said heat mode recording material from said acceptor material when said acceptor layer comprises a modified dextran containing an amino group having a free hydrogen and glyoxal as a hardener.

The presence of an IR-absorbing dye as a substance capable of converting the IR-laser beam radiation into heat is essential as is proven by the printing plates AA-3, BB-3 and CC-3 which were prepared using a heat mode recording material not comprising an IR-absorbing dye. It is clear that the presence of a thermal transferable dye improves the quality of the printed copies as is proven by the results in table 2 (compare AA-1 to AA-2, BB-1 to BB-2, CC-1 to CC-2).

EXAMPLE 2

Preparation of the Heat Mode Recording Materials D-1 till D-3.

These heat mode recording materials are prepared by coating on a polyethylene therephthalate film support having a thickness of 175 μm by means of a knife coater recording layers at a dry weight of 1 g/$m^2$. The composition of the recording layers is given in table 3.

Preparation of the Acceptor Material N.

Preparation of the Coating Solution for the Acceptor Layer.

To 440 g of a dispersion containing 21.5% $TiO_2$ (average particle size 0.3 μm to 0.5 μm) and 2.5% polyvinyl alcohol (hydrolyzed to a degree of about 85%) in deionized water were subsequently added, while stirring, 250 g of a 5% polyvinyl alcohol (hydrolyzed to a degree of about 85%) solution in water, 105 g of a hydrolyzed 22% tetramethyl orthosilicate emulsion in water and 12 g of a 10% solution of a wetting agent. To this mixture was then added 193 g of deionized water and the pH was adjusted to pH=4.

Preparation of the Acceptor Material N.

The coating solution for the acceptor layer was coated on a polyester support containing a subbing layer at a wet coating thickness of 50 g/$m^2$, dried at 30° C. and subsequently hardened by subjecting it to a temperature of 57° C. for 1 week.

Preparation of the Lithographic Printing Plates DD-1 till DD-3.

The recording layer of the appropriate heat mode recording material (D-1 till D-3) is brought in intimate contact with the acceptor layer of a sample of the acceptor material N by means of an adhesive tape. The package of the heat mode recording material and the acceptor material are applied on the cylinder of an external drum laser equipment by means of an adhesive tape and/or vacuum suction. At a frequency of rotation of 800 r.p.m. the package is information-wise exposed through the support of the heat mode recording material, whereby the laser beam (ND-YLF 1053 nm, diameter of the spot 14,9 μm, output 0.4 W) is focused in the recording layer.

Subsequently, the acceptor material is separated from the respective heat mode recording materials yielding the respective printing plates. The respective printing plates are conveyed through a heated roll laminator device at 160° C. and are then used to print on a conventional offset press (GTO-46) using a commonly employed ink (K+E 123W) and fountain (Combifix 3% in water-isopropanol 90:10 by volume). There were printed 1000 copies of each printing plate. The quality of the obtained copies, as judged on the $10^{th}$ copy is given in table 3.

Under the given experimental conditions a single scan with a spot width of 14.9 μm is represented in the recording composition D-1 as a line with a width of 11.3 μm, in the recording composition D-2 as a line with a width of 14.4 μm and in the recording composition D-3 as a line with a width of 15.6 μm.

TABLE 3

| | Composition of recording layer | | | | | | |
|---|---|---|---|---|---|---|---|
| Pr. Pl.[a] | Nr. | IR-1[a] | TDD-2[b] | Pol 3 | NC[c] | Filler[d] | Q Copy[a] |
| DD-1 | D-1 | 17% | 33% | 33% | 0% | 17% | 4 |
| DD-2 | D-2 | 16% | 32% | 31% | 5% | 16% | 4 |
| DD-3 | D-3 | 19% | 39% | 38% | 6% | 0% | 4 |

[a]Pr.Pl., IR-1, Q Copy: see table 2
[a]TTD-2: thermal transferable dye with the following formula

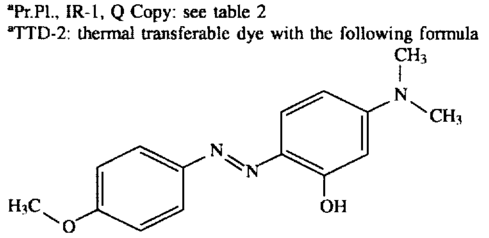

(TTD-2)
[b]NC: nitrocellullose E 510 of Wolff Walsrode
[c]Filler: Carbon black

Evaluation:

It is clear from the results in table 3 that a lithographic printing plate requiring no wet processing can be obtained by a process comprising the steps of image-wise exposing using a laser beam a heat mode recording material comprising on a support a recording composition comprising a fenolformaldehyde resin, the heat transferable dye TTD-2 and an IR-dye while said heat mode recording composition is in contact with the acceptor layer of an acceptor element comprising a flexible support and separating said heat mode recording material from said acceptor material when said acceptor layer comprises a polyvinyl alcohol hardened with hydrolyzed tetramethyl orthosilicate.

Conveying the printing plate through a heated roll laminator device at 160° C. improves the quality of the obtained copies as is clear by comparing the results of example 1 (table 2) with these of example 2 (table 3). It is also clear that the presence of nitrocellulose in the recording layer increases the sensitivity of the heat mode recording material.

EXAMPLE 3

Preparation of the Heat Mode Recording Materials E.

A heat mode recording material E is prepared by coating on a polyethylene therephthalate film support having a thickness of 175 μm (having provided thereon a hydrophilic adhaesion layer) by means of a knife coater a recording layer at a dry weight of 0.7 $g/m^2$ with the following composition:

| | |
|---|---|
| -IR-1 (see table 1, remark b) | 20% |
| -TTD-1 (see table 1, remark c) | 40% |
| -E 910 (nitrocellulose of Wolff Walsrode) | 19% |
| -E 1440 (nitrocellulose of Wolff Walsrode) | 1% |
| -Pol 3 (see table 1, remark d) | 20% |

Preparation of the Acceptor Material O.

Coating of an Intermediate Layer on the Acceptor Material Support.

A polyethylene therephthalate film support containing a subbing layer is coated by means of a knife coater with an intermediate layer comprising gelatin (2.0 $g/m^2$), $SiO_2$ with average particle size 1.8 μm (1.6 $g/m^2$), $SiO_2$ with average particle size 4.0 μm (0.5 $g/m^2$), $TiO_2$ with average particle size 0.3 to 0.5 μm (0.25 $g/m^2$), triacrylformaldehyde (0.16 $g/m^2$) and a fluortenside (0.01 $g/m^2$) and said coating is subsequently hardened by subjecting it to a temperature of 57° C. for 1 week. The Ra value of said layer is 0.9 μm.

Preparation of the Coating Solution for the Acceptor Layer.

To 440 g of a dispersion containing 4.1% $SiO_2$ (with a surface area of 300 $m^2/g$) and 2.5% polyvinyl alcohol (hydrolyzed to a degree of about 85%) in deionized water were subsequently added, while stirring, 250 g of a 5% polyvinyl alcohol (hydrolyzed to a degree of about 85%) solution in water, 55 g of a hydrolyzed 22% tetramethyl orthosilicate emulsion in water and 12 g of a 10% solution of a wetting agent. To this mixture was then added 193 g of deionized water and the pH was adjusted to pH=4.

Preparation of the Acceptor Material O.

The coating solution for the acceptor layer was coated on the above mentioned intermediate layer at a dry coating weight of 0.5 $g/m^2$, dried at 30° C. and subsequently hardened by subjecting it to a temperature of 57° C. for 1 week. The Ra value of the acceptor layer was 0.7 μm.

Preparation of the Lithographic Printing Plates EE-1.

The recording layer of the heat mode recording material E-1 is brought in intimate contact with the acceptor layer of the acceptor material O by means of an adhesive tape. The package of the heat mode recording material and the acceptor material are applied on the cylinder of an external drum laser equipment by means of an adhesive tape and/or vacuum suction. At a frequency of rotation of 800 r.p.m. the package is information-wise exposed through the support of the heat mode recording material, whereby the laser beam (ND-YLF 1053 nm, diameter of the spot 14,9 μm, output 0.4 W) is focused in the recording layer.

Subsequently, the acceptor material is separated from the respective heat mode recording materials yielding a printing plate. This printing plate is conveyed through a heated roll laminator device at 120° C. and is then used to print on a conventional offset press (GTO-46) using a commonly employed ink (K+E 123W) and fountain (Combifix 3% in water-isopropanol 90:10 by volume). There were printed 10,000 copies. The quality of the obtained copies, as judged on the $10^{th}$ copy is excellent.

When the printing plate is not conveyed through a heated roll laminator device at 120° C. and is directly used to print the obtained copies are only of an acceptable to a good quality.

Evaluation:

It is clear from these results that a lithographic printing plate requiring no wet processing can be obtained by a process comprising the steps of image-wise exposing using a laser beam a heat mode recording material comprising on a support a recording composition comprising a fenolformaldehyde resin, nitrocellulose, the heat transferable dye TTD-1 and an IR-dye while said heat mode recording composition is in contact with the acceptor layer of an acceptor element comprising a flexible support and an intermediate layer and separating said heat mode recording material from said acceptor material said acceptor layer comprising a polyvinyl alcohol hardened with hydrolyzed tetramethyl orthosilicate.

The presence in the acceptor material of an intermediate layer having silica particles with average particle size 1.8 μm and 4.0 μm improves the quality of the printed copies (compare the results of example 2, table 3 with the result of example 3). Conveying the printing plate through a heated roll laminator device at 120° C. improves the quality of the obtained copies;

I claim:

1. A method for obtaining a lithographic printing plate requiring no wet processing comprising the steps of image-wise exposing using a laser beam a heat mode recording material comprising on a support a recording composition comprising a hydrophobic polymer and a substance capable of converting the laser beam radiation into heat while said heat mode recording composition is in contact with the acceptor layer of an acceptor element comprising a flexible support, said acceptor layer comprising a hardened non-proteinic hydrophilic polymer obtained by reacting a non-proteinic hydrophilic polymer containing a hydroxyl group or an amino or amido group having a free hydrogen with a hardener capable of reacting with said groups and separating said heat mode recording material from said acceptor material, characterized in that said recording composition comprises a hydrophobic thermal transferable dye in a concentration range of 30 to 50% by weight versus the dry weight of the heat mode recording composition which is transferred at the exposed areas from the recording material to the surface of the acceptor element.

2. A method according to claim 1 wherein the thermal transferable dye is used in an amount from 20% to 60% by weight versus the dry weight of the heat mode recording composition.

3. A method according to claim 1 wherein the thickness of the recording composition is not more than 3 μm.

4. A method according to claim 1 wherein the recording composition of the heat mode recording material comprises oxidizable or explosive substances.

5. A method according to claim 4 wherein the recording composition of the heat mode recording material comprises nitrocellulose in an amount from 5% to 50% by weight versus the dry weight of the heat mode recording composition.

6. A method according to claim 1 wherein said non-proteinic hydrophilic polymer containing a hydroxyl group or an amino or amido group having a free hydrogen is polyvinyl alcohol hydrolyzed to at least an extent of 60 percent by weight.

7. A method according to claim 6 wherein said hardener is a hydrolyzed tetraalkyl orthosilicate.

8. A method according to claim 1 wherein said acceptor layer contains colloidal silica.

9. A method according to claim 1 wherein said acceptor layer contains particles of titanium dioxide having an average size from 0.3 μm to 0.5 μm.

10. A method according to claim 1 wherein said acceptor layer has a Ra value of at least 0.3 μm.

* * * * *